(12) United States Patent
Hosoda et al.

(10) Patent No.: US 7,857,611 B2
(45) Date of Patent: Dec. 28, 2010

(54) IMPRINTING DEVICE AND IMPRINTING METHOD

(75) Inventors: Yasuo Hosoda, Saitama (JP); Tetsuya Imai, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 12/279,481

(22) PCT Filed: Feb. 7, 2007

(86) PCT No.: PCT/JP2007/052115
§ 371 (c)(1),
(2), (4) Date: Sep. 19, 2008

(87) PCT Pub. No.: WO2007/094213
PCT Pub. Date: Aug. 23, 2007

(65) Prior Publication Data
US 2009/0026658 A1 Jan. 29, 2009

(30) Foreign Application Priority Data
Feb. 14, 2006 (JP) .............................. 2006-036001

(51) Int. Cl.
*B28B 3/00* (2006.01)
(52) U.S. Cl. .................. 425/408; 425/352; 425/406; 425/149; 264/239; 264/299
(58) Field of Classification Search ................ 425/408, 425/352, 406, 149; 264/239, 299
See application file for complete search history.

(56) References Cited

U.S. PATENT DOCUMENTS

| 2004/0131718 | A1* | 7/2004 | Chou et al. ................. 425/385 |
| 2006/0127522 | A1* | 6/2006 | Chou ......................... 425/150 |

FOREIGN PATENT DOCUMENTS

| JP | 2-286316 | 11/1990 |
| JP | 02286316 | * 11/1990 |
| JP | 2002-042387 | 2/2002 |
| JP | 2003-67989 | 3/2003 |
| JP | 2003-109254 | 4/2003 |
| JP | 2003-173584 | 6/2003 |
| TW | 1246688 | 1/2006 |

* cited by examiner

*Primary Examiner*—Khanh Nguyen
*Assistant Examiner*—Saeed M Huda
(74) *Attorney, Agent, or Firm*—Young & Thompson

(57) ABSTRACT

After a transfer material was hardened in a situation an imprint mold which has a concave part pattern is forced against the liquid transfer material, a replica which has a convex part pattern corresponding to the concave part pattern by releasing the imprint mold. A pressurization mechanism and a vacuum pump are set, regarding depth K of the concave part pattern of the imprint mold, height k of the convex part pattern of the transfer material, effective pressure Mo while the imprint mold is forced, pressure P in the space, with satisfying: $Mo/P \geqq k/(K-k)$. With this arrangement, even if air comes inside of the concave part pattern of the imprint mold and is stuffed in the inside, it is possible to have transcription with no problem.

10 Claims, 13 Drawing Sheets

[FIG. 1]
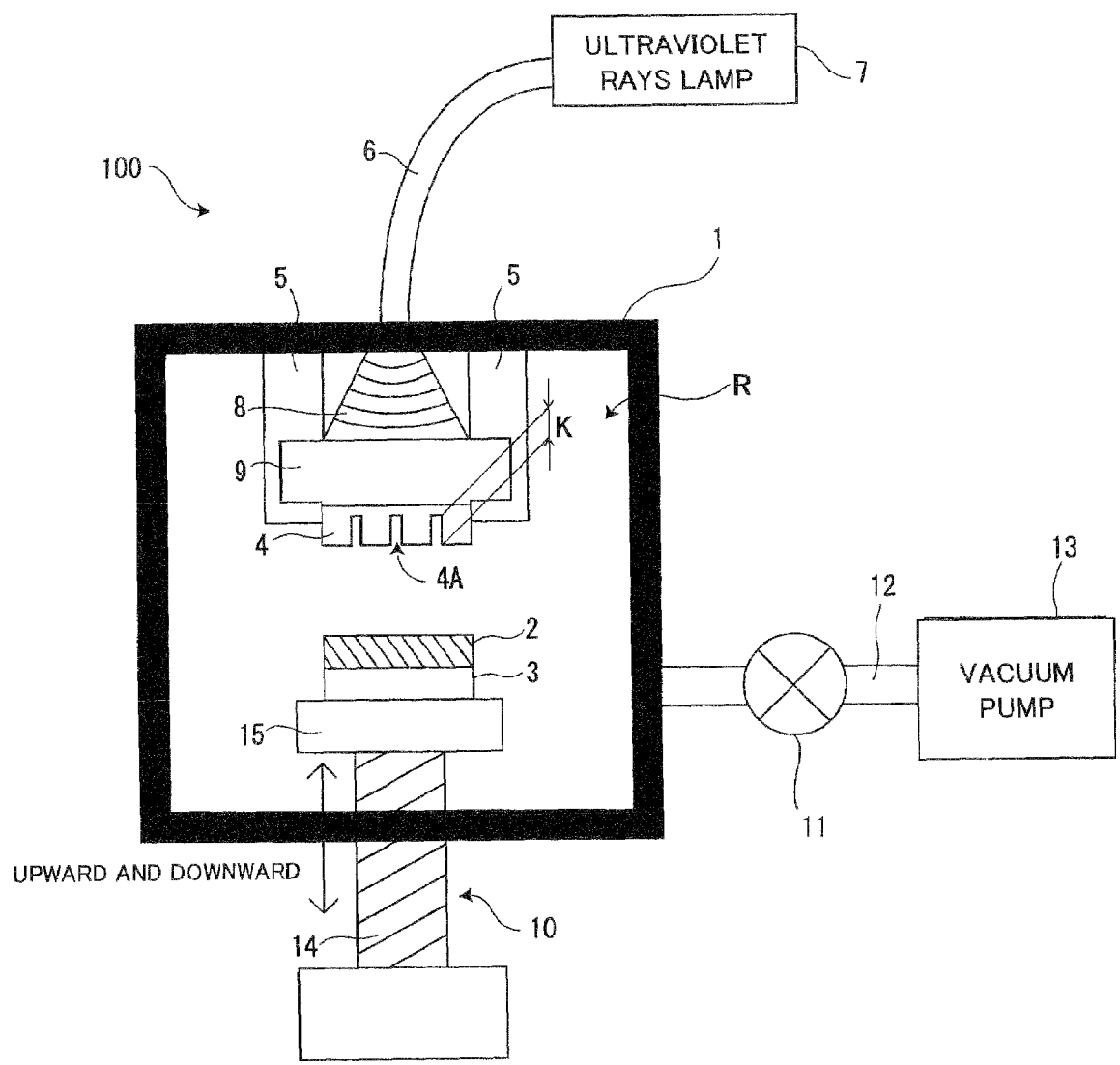

[FIG. 2A] 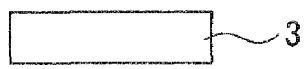
[FIG. 2B] 
[FIG. 2C] 
[FIG. 2D] 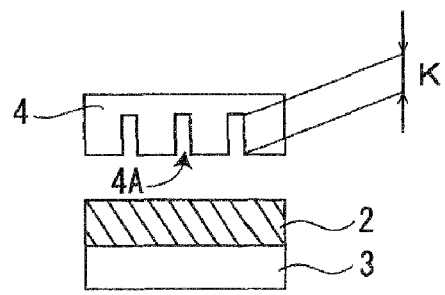
[FIG. 2E] 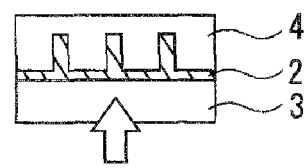
[FIG. 2F]  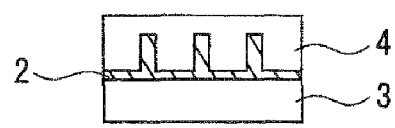 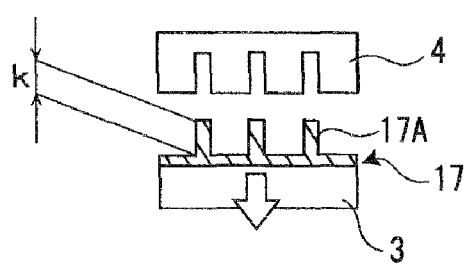

[FIG. 3]
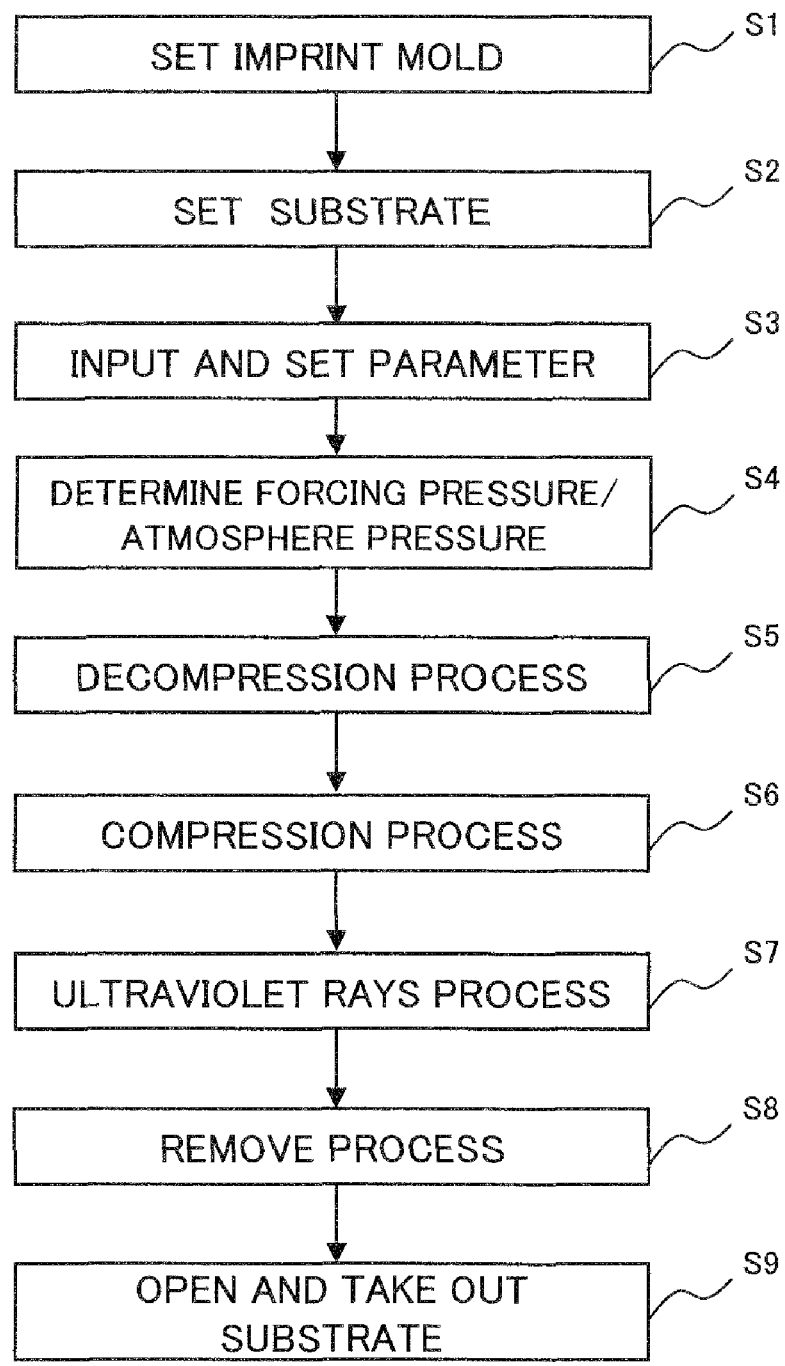

[FIG. 4A]
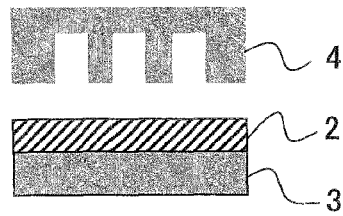
[FIG. 4B]
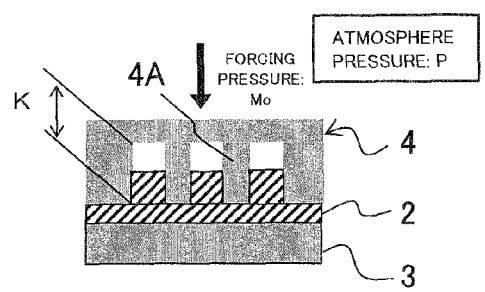
[FIG. 4C]
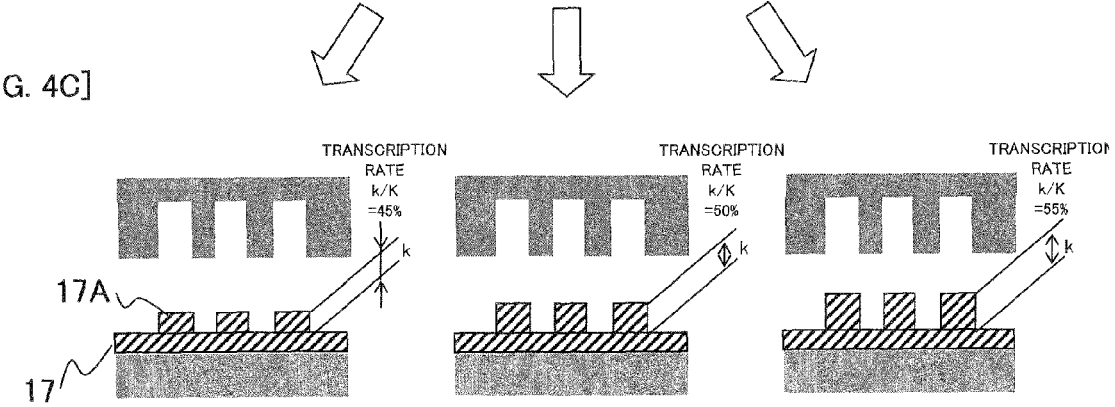

[FIG. 5]
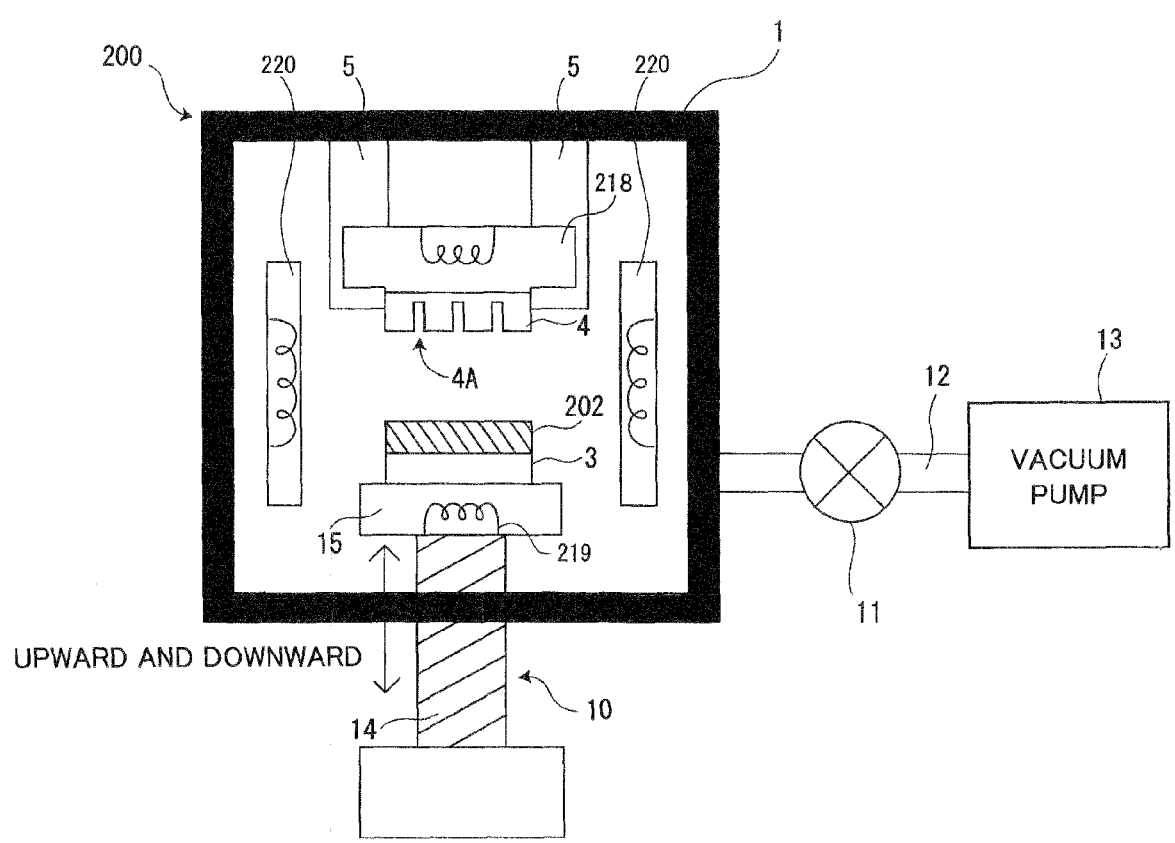

[FIG. 6A]
[FIG. 6B]
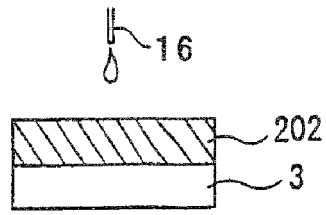
[FIG. 6C]
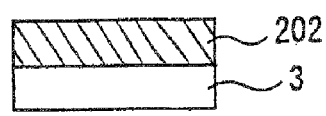
[FIG. 6D]
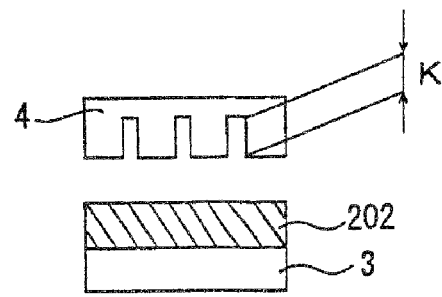
[FIG. 6E]
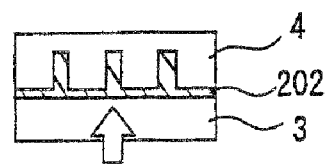
[FIG. 6F]
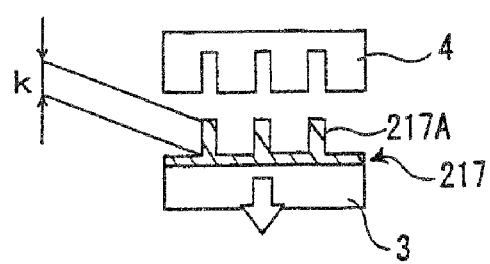

[FIG. 7]
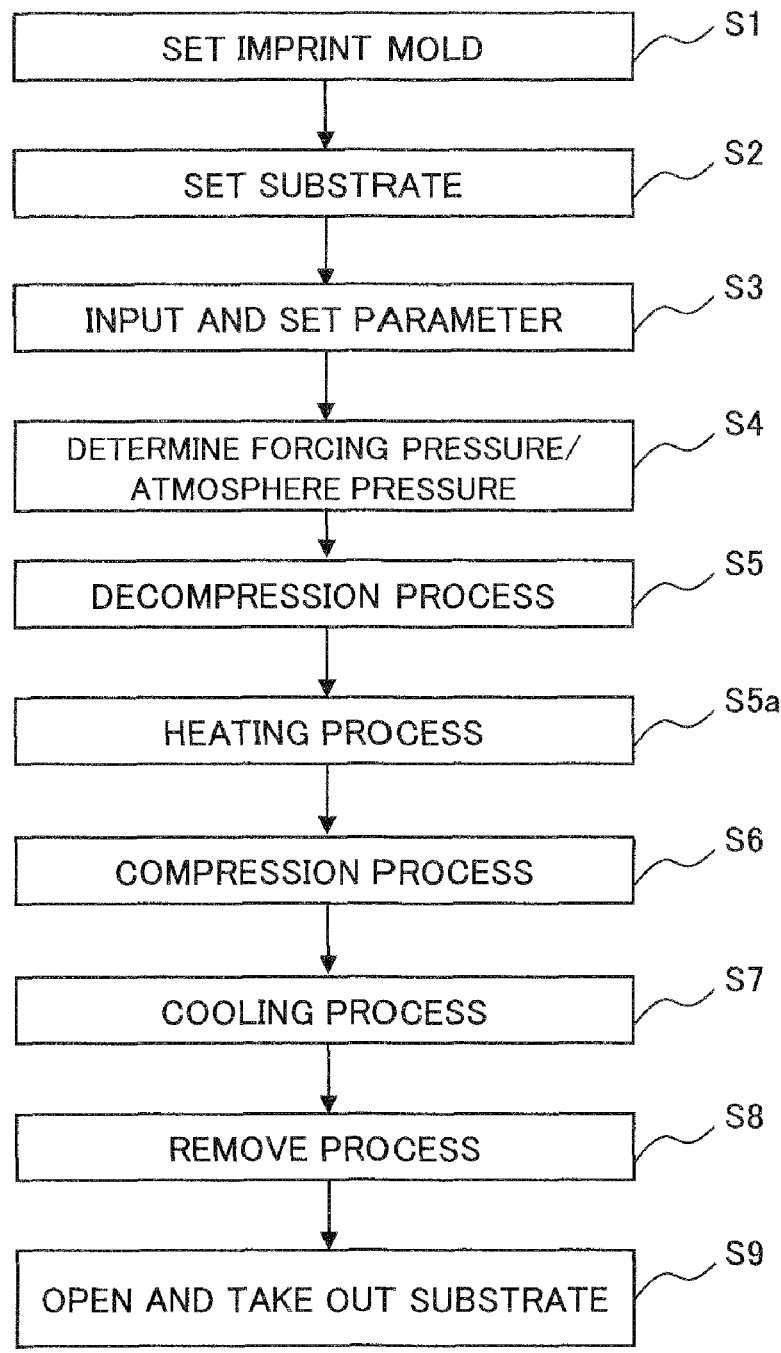

[FIG. 8A] 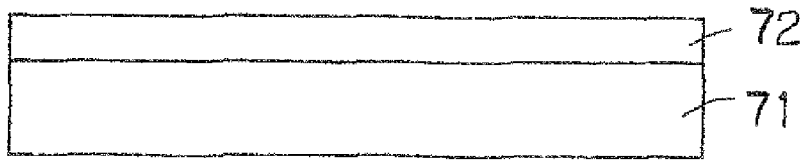
[FIG. 8B] 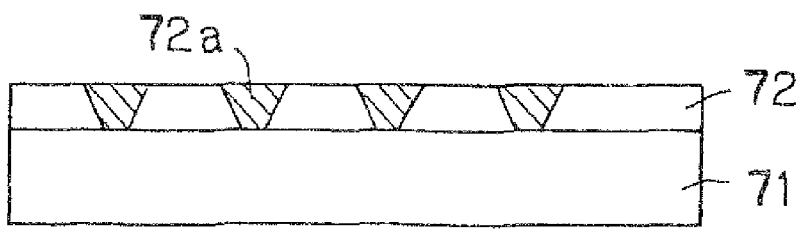
[FIG. 8C] 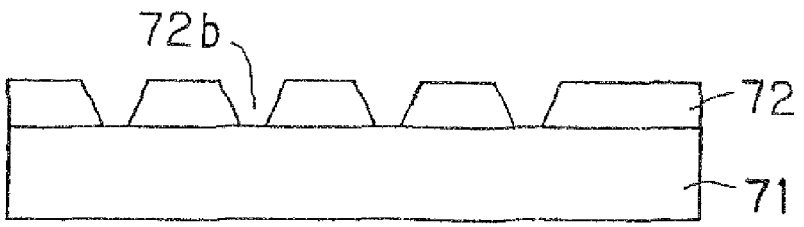
[FIG. 8D] 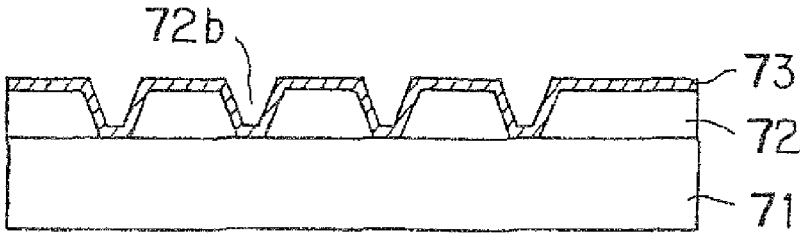
[FIG. 8E] 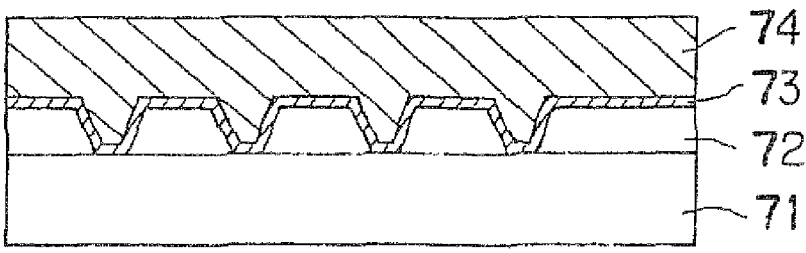
[FIG. 8F] 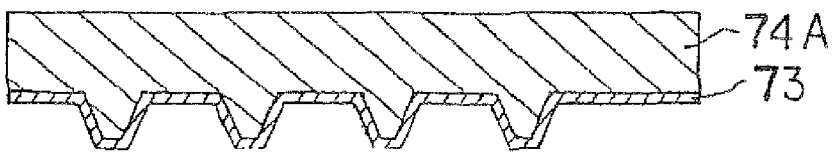

[FIG. 9]
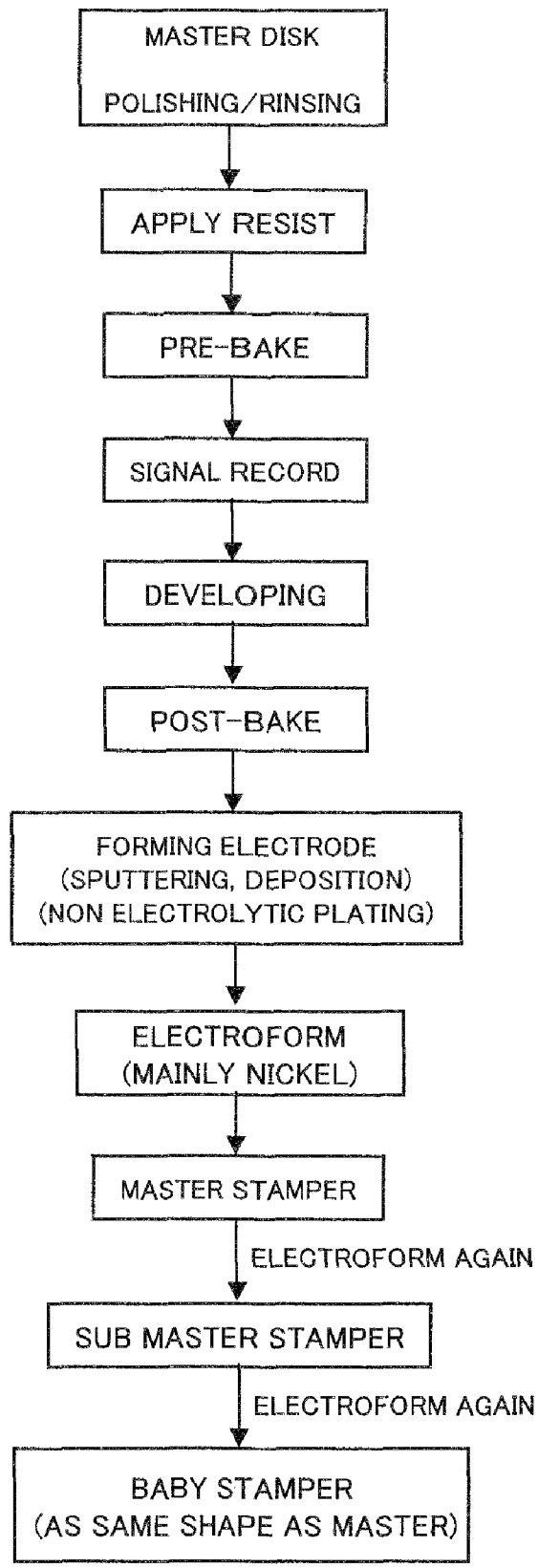

[FIG. 10]
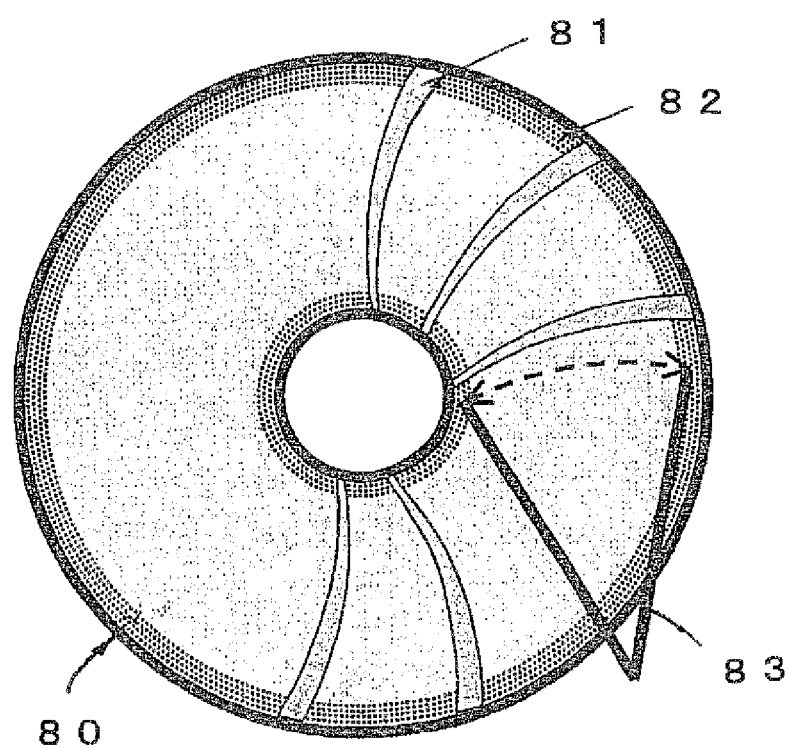

[FIG. 11]
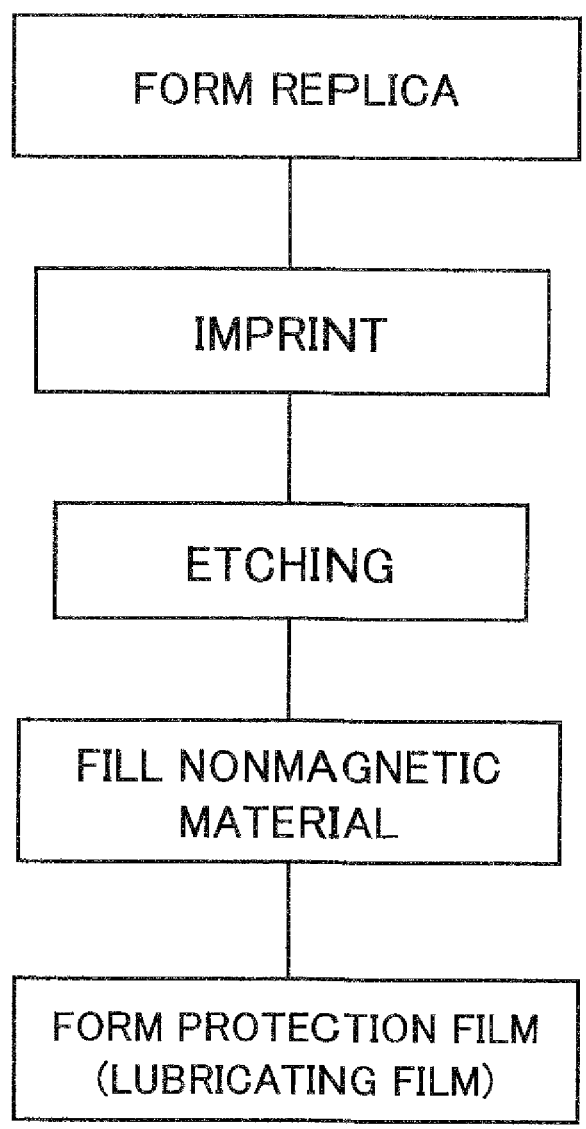

[FIG. 12A]
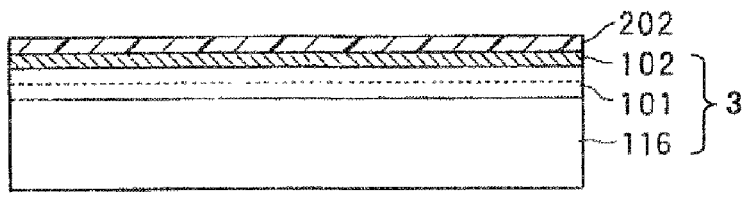
[FIG. 12B]
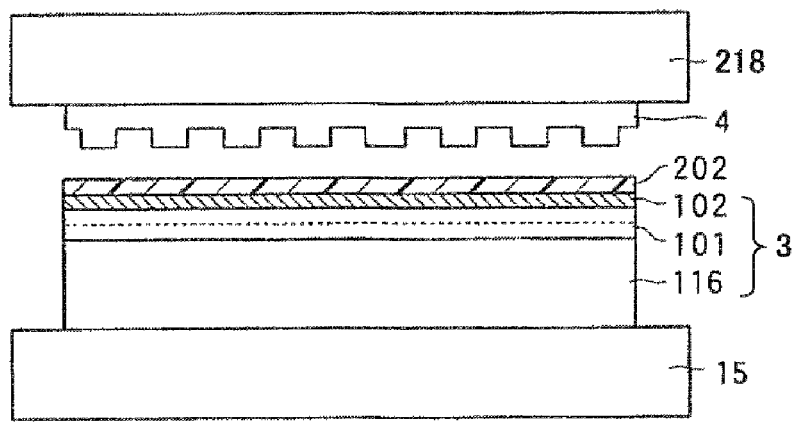
[FIG. 12C]
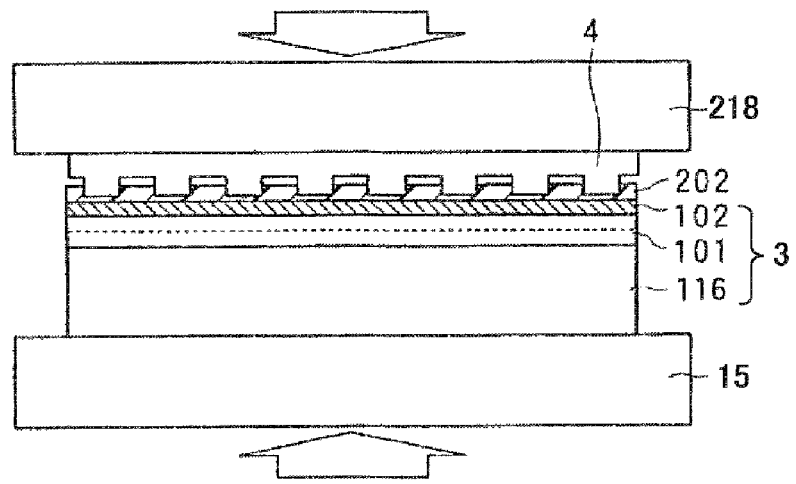
[FIG. 12D]
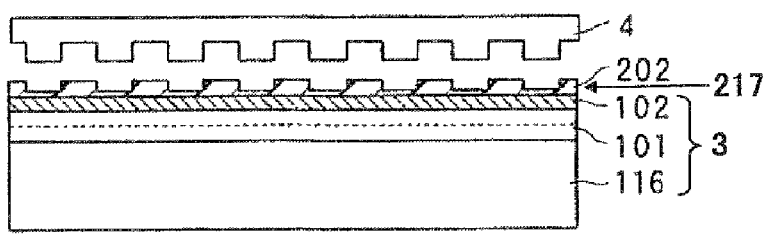
[FIG. 12E]

[FIG. 13F] 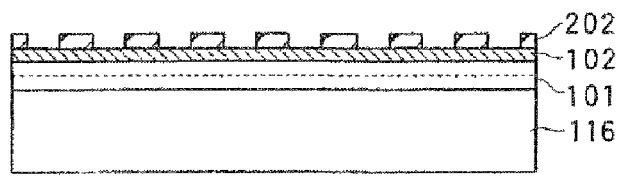
[FIG. 13G] 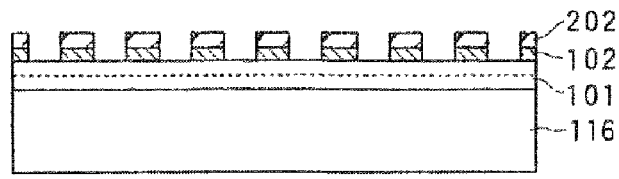
[FIG. 13H] 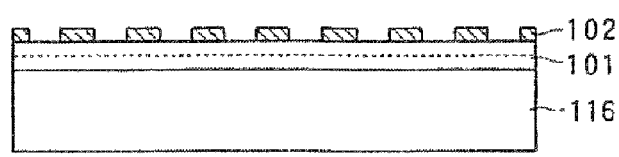
[FIG. 13I] 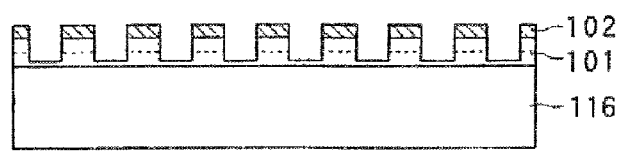
[FIG. 13J] 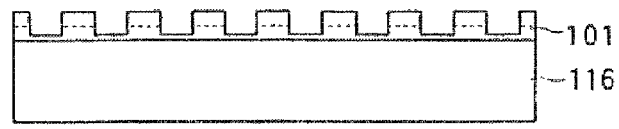
[FIG. 13K] 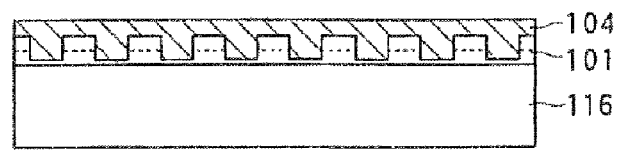
[FIG. 13L] 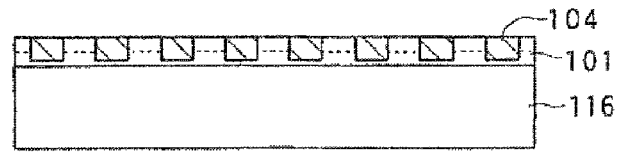
[FIG. 13M] 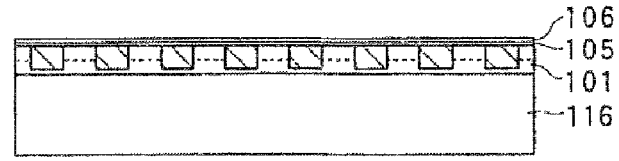

IMPRINTING DEVICE AND IMPRINTING METHOD

CROSS-REFERENCE TO RELATED APPLICATION

This application is based on Japanese Patent Application No. 2006-036001 filed on Feb. 14, 2006, the contents of which is incorporated hereinto by reference.

BACKGROUND OF THE INVENTION

1. Field of the Invention

The present invention relates to an imprint apparatus and an imprint method which forms a replica which is replicated a convex and concave pattern corresponding to a concave and convex pattern, by an imprint mold with the concave and convex pattern being forced on a transfer material.

2. Description of the Related Art

Relating to development about recent nanotechnology, several imprint apparatus are suggested (for example, referring to JP, A, 2003-173584, JP, A, 2003-109254, JP, A, 2003-67989, JP, A, 2002-42387). The imprint apparatus is an apparatus which forms a replica replicated by convex and concave patterns on imprint mold based on compressing power which an imprint mold is forced against liquid transfer materials on a substrate.

For instance, the prior art described in JP, A, 2003-173584 shows a technology for manufacturing recordable information media sheets. These sheets are manufactured to be heat-pressed with a sheet which made from styrene hydride-polymer touched stampers under a decompressed an atmosphere at less than 30 kPa. The prior art described in JP, A, 2003-109254 also shows a technology for manufacturing optical recording substrates. These substrates are manufactured to be heat-pressed an organic high polymer sheet with its surface roughly polished on a stamper under a decompressed atmosphere.

On the other hand, the prior art described in JP, A, 2003-67989 shows a technology for manufacturing a cover layer for information recordable optical media by transcribing groove shape of a stamper on less than or equal 0.2 mm sheet under the several conditions. These conditions are less than or equal 13.33 Pa vacuum rate, 150-300 degrees temperature, 0.5-10 kg/cm$^2$. The prior art described in JP, A, 2002-42387 shows a technology for manufacturing recordable media forced and transcribed stamper surface patterns under in decompressed or vacuumed environment without causing any bubble on the surface on a board or sheet substrate or a recordable layer.

Targets which this imprint apparatus may be applied to are several product fields which an imprint lithography technology is applied to: a semiconductor related field, a magnetic recording apparatus (discrete track media. Patterned Media) related field, a device (razor, optical transmission lines, an so on) related field, a minute processing pars related field such as MEMS (Micro Electro Mechanical System: a technology for combining micro electronics and micro machining), NEMS (Nano Electro Mechanical System: Nano Electromechanical System technology), manufacturing process for the next generation recording media.

As the above described, the imprint apparatus transcribes the imprint mold on the transfer material. At this time, the transfer material comes into a concave part pattern by compressed pressure and the patterns are turned into a convex part pattern correspond to the concave part pattern. In this situation, when the transfer material comes into the concave part pattern of the imprint mold, it is likely that air comes into the concave part. The air which comes into is sealed up at the bottom of the concave part by the transfer material and has no way to come out. Therefore, the existence of the sealed up air effect on the transcription efficiency.

The prior art described in JP, A, 2003-173584 focuses on a topic which try not to be caught air by limiting atmosphere pressure on specific pressure condition by using a 20 tons press machine. However, the prior art does not take it into consideration to have desirable transcription even if air is caught. The prior art does not particularly show any obvious conditions in terms of forcing power (press pressure). It is possible not to be able to have sufficient transcription if the forcing power is changed under indicated certain decompression atmosphere.

The prior art described in JP, A, 2003-109254 also focuses on a topic which try not to be caught air by making easy to release air by make a sheet surface rough and by atmosphere decompression. The prior art independently provides each range in terms of decompression and compression conditions, according to a pair of these conditions the probability not to have sufficient transcription will get higher.

In the prior art described in JP, A, 2003-67989 simply tries to limit forcing pressure condition under a fixed atmosphere pressure condition (vacuum rate environment). Therefore, the prior art does not also take it consideration to have desirable transcription even if air is caught. The vacuum of atmosphere pressure and forcing condition are independently performed each range. According to these pairs it is likely not to have sufficient transcription. Further, transcribed status is decided only by recording characteristic status in terms of recordable disks, and is not evaluated by patterns shape and transcription rate. To think about an imprint apparatus in general, the transcription result seems to have probability not to be enough.

The prior art described in JP, A, 2002-42387 primarily focuses on prevention to cause bubbles made from a resin over-heated up to glass transition point and decomposition melting point (in other words, equal to exclusion of liquid resinous bubbles). The prior art does not take it in consideration to be able to have desirable transcription even if air is caught. The prior art does not particularly make the condition clear in terms of forcing pressure. According to a pair with atmosphere pressure the forcing pressure has potential that sufficient transcription is not held.

In this way, the above described each prior arts adopt imprint apparatus as a developed style of a resin molding apparatus and press machines which determine the condition focused on relation between temperature and pressure under normal temperature. Or the prior arts adopt imprint apparatus as a developed style of a transcription apparatus with ultraviolet rays curable resin which tries to imprint with almost no pressure under vacuum environment. According to each of these prior arts, the each limited desirable condition during these imprint apparatus are used, is got simply by try and error method. Therefore, in each of the prior arts it is not taken it in consideration that the condition which makes it possible to have desirable transcription in case air comes into the concave part pattern of the imprint mold with the transfer materials.

Therefore, to make it possible to have enough transcription even if the air comes into the concave part pattern of the imprint mold, it is necessary to raise the forcing power extremely high or to reduce the atmosphere pressure extremely low. To realize the extremely high pressurization or the extremely low vacuum rate, there is a problem that the apparatus gets complicated and large sized.

The above described problem is given as one of examples the present invention should solve.

SUMMARY OF THE INVENTION

To solve the subject, the invention is an imprint apparatus that forms a replica which has a convex part pattern corresponding to a concave part pattern, comprising: a substrate on which a transfer material is put; an imprint mold which has the concave part pattern; a forcing unit which generates forcing power to force the imprint mold against the transfer material on the substrate at effective pressure Mo [Pa]; a pressure adjusting unit which performs pressure adjusting an atmosphere at pressure P [Pa] in a space in which the imprint mold and the substrate exist; and a control means; wherein: the control unit controls the forcing unit and the pressure adjusting unit based on depth K [nm] of the concave part pattern of the imprint mold and height k [nm] of the convex part pattern of the replica.

To solve the subject, the invention provides the pressure adjusting unit is a decompression unit.

To solve the subject, in the invention the control unit controls the forcing unit and the pressure adjusting unit with satisfying: $Mo/P \geq k/(K-k)$.

To solve the subject, in the invention the control unit controls the forcing unit and the pressure adjusting unit, in case height k [nm] of the convex part pattern is less than the depth K, with satisfying: $1.1k/(K-1.1k) \geq Mo/P \geq 0.9k/(K-0.9k)$.

To solve the subject, the invention is an imprint method for forming a replica which has a k [nm] height convex part pattern corresponding to a concave part pattern, by forcing an imprint mold which has a K [nm] depth concave part pattern against a liquid transfer material under atmosphere pressure P [Pa], and releasing the imprint mold after the transfer material was hardened in this forced situation, wherein: the forcing and the atmosphere pressure are set with satisfying: $Mo/P \geq k/(K-k)$.

To solve the subject, the invention is an imprint method for forming a replica which has a k [nm] height convex part pattern corresponding to the concave part pattern, by forcing an imprint mold which has a K [nm] depth concave part pattern against a liquid transfer material under atmosphere pressure P [Pa], and releasing the imprint mold after the transfer material was hardened in this forced situation, wherein: the forcing and the atmosphere pressure are performed to set with satisfying: $1.1k/(K-1.1k) \geq Mo/P \geq 0.9k/(K-0.9k)$.

BRIEF DESCRIPTION OF THE DRAWINGS

FIG. 1 is an abbreviated structure view showing schematic whole structure of the imprint apparatus as an embodiment of the present invention;

FIG. 2 is a descriptive drawing conceptually showing each of procedures of the imprint methods performed by the imprint apparatus in FIG. 1;

FIG. 3 is a flowchart conceptually showing each of the control procedures of the imprint methods performed by the imprint apparatus in FIG. 1;

FIG. 4 is a descriptive drawing showing a state in case transcription margin is allowed;

FIG. 5 is an schematic configuration view showing abbreviated whole configuration of the imprint apparatus which uses thermoplastic resin as a transfer material as the variation;

FIG. 6 is a descriptive diagram conceptually showing each of the procedures the imprint methods performed by the imprint apparatus in FIG. 5;

FIG. 7 is a flowchart conceptually showing each of the control procedures of the imprint methods performed by the imprint apparatus in FIG. 5;

FIG. 8 is a sectioned drawing showing procedures during manufacturing an imprint mold for imprinting;

FIG. 9 is a process flowchart showing detail of procedures for manufacturing an imprint mold for imprinting;

FIG. 10 is a plan view showing a patterned magnetic recording medium manufactured by the imprint mold;

FIG. 11 is a process flowchart showing an embodiment manufacturing the patterned magnetic recording medium;

FIG. 12 is a sectioned drawing showing detail of procedures for manufacturing the patterned magnetic recording medium;

FIG. 13 is a sectioned drawing showing detail of procedures for manufacturing the patterned magnetic recording medium;

DETAILED DESCRIPTION OF THE PREFERRED EMBODIMENTS

The following describes an embodiment of the present invention with reference to accompanying drawings. The present embodiment is an embodiment in which an imprint apparatus uses ultraviolet rays curable resin, and so on as a transfer material, which has less temperature change during imprinting.

FIG. 1 is an abbreviated structure view showing schematic whole structure of the imprint apparatus 100 of the present embodiment. In FIG. 1, the imprint apparatus 100 comprises: a vacuum chamber 1 which configures a decompression chamber; a substrate 3 which is provided in vacuum chamber 1, on which a transfer material 2 (in this example, ultraviolet rays curable resin which has less temperature change during imprinting) is put, which has liquidity on certain condition; an imprint mold 4 (mold) which is provided in this vacuum chamber 1, and has a K [nm] depth concave part pattern 4A; a mold holding mechanism 5 for holding the imprint mold 4 on a wall surface (in this example, an upper wall) on the vacuum chamber 1; an ultraviolet rays lamp 7 connected to the vacuum chamber 1 via an optical fiber cable 6, and for providing ultraviolet light inside of the vacuum chamber 1; a ultraviolet ray irradiating lens 8 which enlarges an ultraviolet rays beam led inside the vacuum chamber 1; a transparent supporting body window 9 which is provided on the upper part of the imprint mold 4, and for irradiating the enlarged ultraviolet rays beam on the transfer material via the imprint mold 4; a pressurization mechanism 10 generates forcing power for forcing the imprint mold 4 against the substrate 3; a vacuum pump 13 which is connected to the vacuum chamber 1 via a pipe 12 has a bulb 11, and decompresses an atmosphere in the vacuum chamber 1.

In this example, the pressurization mechanism 10 comprises: a drive axis 14 which is rotated by a not shown hydraulically-operated apparatus; a substrate supporting body 15 which is provided capable for moving upward and downward by screwing up to tightened with a screw provided on a surface of the drive axis 14. The above described substrate 3 is provided on the substrate support body 15. The pressurization mechanical 10 is set forcing power just like the imprint mold 4 is forced against the transfer material 2 at pressure M [Pa](in this case, equal to effective pressure Mo. Refer to the below described variation of (1)). On a side note, the forcing power may be fixed, or allowed to be set to be variable using not shown operating means by an operator, or automatically set to be variable.

The vacuum pump 13 is set pumping power to decompress the space R inside of the vacuum chamber 1 in which the imprint mold 4 and the substrate 3 exist. On a side note, this pumping power may be fixed, or allowed to be set to be variable using not shown operating means by an operator, or automatically set to be variable.

FIG. 2A to 2F are descriptive drawings conceptually showing each of procedures of the imprint methods performed by the above configured imprint apparatus 100.

At first, a layer of the transfer material 2 is formed (Shown in FIG. 2B), by applying the transfer material 2 (ultraviolet rays curable resin) via a nozzle 16 (not shown in FIG. 1) provided in the vacuum chamber 1 in appropriate way.

Afterwards, the vacuum pump 13 is operated, to make atmosphere pressure in the space R inside of the vacuum chamber 1 decompressed to set at P [Pa] (Shown in FIG. 2(b)).

After decompressed like this way, the pressurization mechanism 10 operates and lifts the substrate supporting body 15. Through this motion, the imprint mold 4 is forced at pressure M against the transfer material 2 on the substrate 3 (Shown in FIG. 2D). In the situation the imprint mold 4 is forced against, the transfer material 2 is hardened through being irradiated ultraviolet light by working the ultraviolet rays lamp 7.

After hardened through this process, the substrate supporting body 15 is gone downward by operating the pressurization mechanism 10 again. Through this motion, the imprint mold 4 is removed from the transfer material 2, and the replica 17 is formed. The replica 17 has a k [nm] height convex part pattern 17A corresponding to the concave part pattern 4A (Shown in FIG. 2F). Afterwards, the vacuum pump 13 is stopped, and the atmosphere of the space R inside of the vacuum chamber 1 is got back up to normal pressure. The substrate 3 on which the above configured replica 17 is put, is taken from the vacuum chamber 1 via not shown opening and closing means. The transcription is finished.

As the above described a series of processes, at the present embodiment, the pressurization mechanism 10 and the vacuum pump 13 perform to generate the forcing power and decompress, regarding depth K of the concave part pattern of the imprint mold 4, height k of the transfer material, pressure M while the imprint mold 4 is forced, pressure P in the space R with satisfying: $M/P \geq (k/(K-k))$.

FIG. 3 is a flowchart conceptually showing each of the control procedures of the imprint methods performed by using the above configured imprint apparatus 100. On a side note, the content of the flowchart shows work examples performed by control unit on the imprint apparatus 100, and primarily shows, for instance, a flowchart from a view point by a control program. At the flowchart, for example, UV system (ultraviolet rays irradiation system) is adopted.

At first, in step S1, the imprint mold 4 is set. Next, in step S2, the control program instructs to set the substrate 3. In this situation, on the substrate 3, a layer of the transfer material 2 (ultraviolet rays curable resin) is formed by an applying apparatus which is individually prepared in advance. In case the transfer material 2 is not formed in advance, further in the step S2, the control program forms a layer of the transfer material 2 on the substrate 3 by applying the transfer material 2 via the nozzle 16 (not shown in FIG. 1) performed in the vacuum chamber 1 in an appropriate status. Next, in step S3, a parameter is set. Concretely speaking, depth K of the concave part pattern 4A and height k of the convex part pattern 7A formed on the transfer material 2, are inputted. Through this sort of setting, the pressurization mechanical 10 and the vacuum pump 13 perform to generate forcing power and decompression with satisfying: $M/P \geq k/(K-k)$, regarding depth K of the concave part pattern 4A of the imprint mold 4, height k of the convex part pattern 4A on the transfer material 2, pressure M while the imprint mold 4 is forced against, pressure P in the space R.

Next, in step S4, the control program determines pressure given by the pressurization mechanism 10 and atmosphere pressure given by the vacuum pump 13 based on these set parameters.

Next, in step S5, the control program adjusts the atmosphere pressure, by working the vacuum pump 13 to decompress down to P [Pa] the atmosphere pressure of the space R inside of the vacuum chamber 1.

After the decompression like this status, in step S6, the control program raises a substrate supporting body 15 by working the pressurization mechanism 10. As a result, the imprint mold 4 is forced at pressure M against the transfer material 2 on the substrate 3. Next, in step S7, the control program irradiates ultraviolet light to the transfer material 2 by working the ultraviolet rays lamp 7 in a situation on which the imprint mold 4 is forced against. The transfer material 2 is hardened.

After hardening like this status, in step S8, the control program gets the substrate supporting body 15 go downward by working the pressurization mechanism 10 again. Afterwards in step S9, the control program stops working the vacuum pump 13 and makes atmosphere pressure of the space R inside of the vacuum chamber 1 get back to normal pressure. The control program takes the substrate 3 on which the above configured replica 17 is put, from the vacuum chamber 1 via not shown opening and closing means.

In the series of the processes, in the present embodiment, the above described control program is controlling the above described forcing unit (pressurization mechanism) and the above described pressure adjusting unit 13 (vacuum pump) based on depth K [nm] of the concave part pattern 4A on the imprint mold 4 and height k [nm] of the convex part pattern 17A on the replica 17.

As above explained, the imprint apparatus of the present embodiment comprises: a substrate 3 on which a transfer material 2 is put; an imprint mold 4 which has a concave part pattern 4A; a forcing unit (in this example, the pressurization mechanism 10) which generates forcing power to force the imprint mold 4 against the transfer material 2 on the substrate 3 at effective pressure Mo [Pa]; a pressure adjusting unit (in this example, the vacuum pump 13) performs pressure adjusting an atmosphere at pressure P [Pa] in a space R in which the imprint mold 4A and the substrate 3 exist; and a control unit (the control program and the like), forms a replica 17 which has a k [nm] height convex part pattern 17A corresponding to the concave part pattern 4A, by releasing the imprint mold 4A from the transfer material 2 after hardening the transfer material 2 under a situation in which the imprint mold 4A is forced against, wherein: the control unit controls the forcing unit 10 and the pressure adjusting unit 13 based on depth K [nm] of the concave part pattern 4A on the imprint mold 4 and height k [nm] of the convex part pattern 17A on the replica 17.

The imprint apparatus of the present embodiment is characterized that the pressure adjusting unit 13 is a decompression unit 13.

The imprint apparatus of the present embodiment is characterized that the control unit controls the forcing unit 10 and the pressure adjusting unit 13 with satisfying: $Mo/P \geq k/(K-k)$.

As above explained, the imprint method of the present embodiment is characterized for forming a replica 17 which has a k [nm] height convex part pattern 17A corresponding to a concave part pattern 4A, by forcing an imprint mold 4 which has a K [nm] depth concave part pattern 4A against a liquid transfer material 2 at atmosphere pressure P [Pa], and releasing the imprint mold 4A after the transfer material 2 was hardened in this forced situation, wherein: the forcing and the atmosphere pressure are performed to set with satisfying: $Mo/P \geq k/(K-k)$.

In the imprint apparatus 100, by the imprint mold 4 is forced against the liquid transfer material 2 on the transcription 3, the transfer material 2 comes into the concave part pattern 4A of the imprint mold 4 by compressing power at this time, by forcing the imprint mold 4 against the liquid transfer material 2 on the substrate 3. As a result, the transfer material 2 is formed the convex part pattern 17A correspond to the concave part pattern 4A, and turn into the imprint mold 17. On a side note, the present embodiment is a case to be pressurized from downward positively by the substrate 3 is lifted by the pressurization mechanism 10 against the imprint mold 4 which is on a fixed side. Inversely, the present embodiment has two cases in case an imprint mold is vertically moved upward and downward against the substrate which is on a fixed side. One of these cases is to force by the transcription itself weigh, and the other case is to force by making positively it go downward by a pressurization mechanism.

In this situation, to think additionally about a situation air comes into the concave part 4A when the transfer material 2 comes into the concave part 4A. In general, a hole part of the concave part 4A of the imprint mold 4 is small compared to the gross area of a whole pattern area of the imprint mold 4. In case to imprint forcing the imprint mold 4 against the liquid transfer material 2 in a short period, it is not necessary to take it in consideration that the transfer material 2 gets reduced through being pushed out from the edge of the imprint mold 4. Then, If the height k [nm] transfer material 2 comes into the depth K [nm] concave part 4A while the imprint mold 4 is forced against the transfer material 2 at pressure M [Pa] (in this example, pressure to the imprint mold 4 is uniform and equal to effective pressure Mo) under a pressure circumstance is at atmosphere pressure P [Pa] (atmospheric pressure $1*10^5$ [Pa] or a certain decompressed circumstance), the rest of a height K-k [nm] air layer is compressed by being stuffed up with the height k [nm] transfer material. Accordingly, regarding this air layer, the following numerical expression is approved under equal circumstances by the Law of Boyle-Charles.

$$(P+Mo)*(K-k)=P*K$$

In other wards, the following expression is satisfied.

$$Mo/P=k/(K-k)$$

Accordingly, if the following relation is hold that the left side of the above mentioned expression becomes less than or equal to the right side of it;

$$Mo/P \geq k/(K-k) \qquad \text{(expression 1)}.$$

According to the expression 1 (in other wards, by getting the atmosphere pressure P less than or equal to certain value which an equal sign is approved, or getting the effective pressure Mo more than or equal to certain value which an equal sign is approved)), even if air comes inside of the concave part pattern 4A and is stuffed up it is possible to have transcription with no problem.

In the present embodiment, by intending the above described relation is satisfied, such as a necessary condition for sure transcription under unintended air coming inside, under its condition is approved, it is not necessary to decompress unnecessarily too much up to low pressure, and to generate unnecessarily too much forcing power by the decompression unit 13. With this arrangement, it is possible to downsize and simplify apparatus 100.

At this time, in case it is wanted to have so called perfect transcription for instance, transcription rate gets up to 90-99 percentages, the forcing unit 10 and decompression unit 13 are intended to perform as if the following is satisfied;

$$99 \geq Mo/P \geq 9.$$

In other words, as described above, in case height of the transfer material 2 occupies k [nm] in the depth K [nm] of the concave part 4A of the imprint mold 4, and height of the rest air layer is K-k [nm]), the next expression is approved.

$$Mo/P=k/(K-k)$$

To realize 90 percentages transcription rate, regarding depth K of the concave part 4A as 100 percentages, as it is preferable that height k of the transfer material 2 occupies 90 percentages, and height K-k of the air layer occupies 10 percentages, the next expression is approved.

$$Mo/P=k/(K-k)=90/10=9$$

In the same way, to realize 99 percentage transcription rate, as it is preferable that height k of the transfer material 2 occupies 99 percentages and height K-k occupies 1 percentage as height K [nm] of the concave part pattern 4A is 100 percentages; the following expression is approved.

$$Mo/P=k(K-k)=99/1=99$$

Accordingly, in the imprint apparatus 100 it is possible to realize so called "perfect transcription": from 90 to 99 percentages transcription rate, with satisfying:

$$99 \geq Mo/P \geq 9.$$

On a side note, the imprint apparatus 100 of the present embodiment is characterized in further comprising: an input unit which inputs depth K [nm] of the concave part pattern 4A, height k [nm] of the convex part pattern 17A.

As the above described, in the imprint apparatus 100 of the present embodiment, by making settings about forcing power and atmosphere pressure satisfying the above described (expression 1), it is possible to have sufficient transcription (even though air comes into the concave part 4A). Accordingly, for example, in case it is possible to have only low vacuum (a few Pa) by a rotary pump as decompress unit 13, if the "expression 1" is intended to be satisfied as a result by using forcing unit 10 for heavy load, it is possible to have sufficient transcription (in this case decompression unit 10 is able to be simplified). By contrast, in case if adopted something (sample and the like) which is not affordable to too much load if used as the transfer material 2, the "expression 1" is intended to be satisfied as a result by using decompression unit 13 which can realize high vacuum rate, it is possible to have sufficient transcription and in this case it is possible to simplify the forcing unit 10. With this arrangement, it is possible to downsize and simplify compared to an imprint apparatus of the prior art, and to reduce cost. From a viewpoint like this, more concrete applied example will of the imprint apparatus on the present embodiment be shown as below.

On a side note, in this applied example the structure is different from the structure shown in FIG. 1, picking up a case as an example in which the mobile imprint mold 4 is moved downward from the upper position against the substrate 2 as the above described fixed side. In the following explanation there are two cases: one case is to have pressurization by weigh of the imprint mold 4 itself, the other case is to have pressurization by positively forcing downward by the pressurization mechanical 10 in addition to weigh.

In the above described configuration, it is taken into consideration that it is necessary to have pattern height k of the convex part 17A is equal to 100 [nm], adopting the imprint mold 4 forced by its weigh at approximately 40 [Pa].

(a) pressurization condition in case the convex part 17A which would like to be configured as depth K=110 [nm] (including extra 10 percents than necessary size) of the concave part pattern 4A and height k=100 [nm] under normal pressure;

The above described "expression 1" is substituted the following parameters: P=1*10$^5$, k=100, K=110, and it has better being forced at Mo≧1*10$^6$ [Pa].

(b) pressurization condition in case the convex part 17A which would like to be configured as depth K=101 [nm] (including extra 1 percent than necessary size) of the concave part pattern 4A and height k=100 [nm] under normal pressure;

The above described "expression 1" is substituted the following parameters: P=1*10$^5$, k=100, K=101, and it has better have been forced at Mo≧1*10$^7$ [Pa].

(c) pressurization condition in case the convex part 17A which is wanted to be configured as depth K=101 [nm](including extra 1 percent than necessary size) of the concave part pattern 4A and height k=100 [nm] under decompressed circumstance at 100 [Pa] pressure;

The above described "expression 1" is substituted the following parameters: P=1*10$^2$, k=100, K=101, and it has better being forced at Mo≧1*10$^4$ [Pa].

(d) decompression condition in case the convex part 17A which height k is 100 [nm], would like to be configured by weigh of the imprint mold 4 itself as depth K-110 [nm] (including extra 10 percents than necessary size) of the concave part pattern 4A;

The above described "expression 1" is substituted the following parameters: Mo=40, k=100, K=110, and it has better being decompressed until "P≦4 [Pa]" is satisfied.

(e) decompression condition in case the convex part 17A which height k is 101 [nm], would like to be configured by weigh of the imprint mold 4 itself as depth K=101 [nm] (including extra 1 percent than necessary size) of the concave part pattern 4A;

The above described expression 1 is substituted the following parameters: Mo=40, k=100, K=101, and it has better being decompressed until "P≦4 [Pa]" is satisfied.

Note that the present invention is not limited to the above embodiment, and many variations are possible without departing from the scope and technical concept thereof. Such variations are described in order blow.

(1) In Case Forcing Power is Uniform;

The imprint apparatus 100 is preferable that the transfer material 4 is uniformly forced against the transfer material 2, however, regarding apparatus configuration, in case the imprint mold 4 obliquely touched the transfer material 2, or in case there is a large area and small concave and convex part in the contact area between the imprint mold 4 and the transfer material 2, and so on, it is possible to cause distribution on forcing power. In this ease it is preferable to set to be able to have sure transcription at a minimum forcing pressure point in the distribution.

That is, regarding an inside area minim urn forcing pressure Mmin [Pa] as effective pressure Mo in a contact area between the imprint mold and the transfer material;

$$M\min/P \geqq k/(K-k) \qquad \text{(expression 2)}.$$

If the above expression is satisfied it is possible to have the transcription on the worst condition, at a viewpoint over whole apparatus, it is surely possible to have the transcription.

In the imprint apparatus 100 in the variation, the forcing unit 10 and the decompression unit 13 perform to generate the forcing power and decompress, using an inside area minimum forcing pressure Mmin [Pa] of a contact area between the imprint mold 4 and the transfer material 2 as the effective pressure Mo with satisfying:

$$M\min/P \geqq k/(K-k).$$

With this arrangement, practically, for instance, in case there is insufficiency about forcing power scattering by the forcing unit 10 of the imprint apparatus 100, and smoothness in an inside area of the imprint mold 4, the transfer material 2 and the like, it is surely possible to have transcription.

(2) In Case to Have Transcription Margin;

For instance, not necessarily, sticking with high transcription rate, if the preferable convex part pattern 17A on the replica 17 is configured to have twice depth than depth K in the concave part pattern 4A in the imprint mold 4 and at approximately 50 percents transcription rate, according to the above described "expression 1", the necessary condition is;

$$Mo/P \geqq 1$$

The above described "expression 1" is enough condition. As the above described, if used together with the technology which enlarges depth K of the concave part pattern 4A of the imprint mold 4 against height k of the desired a convex part pattern 17A, it is possible to simplify the imprint apparatus 100 much more.

Next, in case to have transcription aiming at relatively low transcription rate: approximately a couple decade percentages as a target, if the practically performed transcription rate is set to have an upper and lower range (transcription margin) against the target transcription rate, it makes a range for setting degree of freedom.

Showing the above described the "expression 1" again as below, in case not to have the margin, the next expression is approved;

$$Mo/P = k/(K-k)$$

In this situation, thinking about a case to have ±10 percents allowance as the transcription margin (allowing ±10 percents range against transcription height as a target), at first, regarding minus 10 percents it had better being occupied as height k2 is 90 percentages at this time and air layer height K−k2 is 10 percentages, hence;

$$Mo/P = k2/(K-k2) = 90/10 = 9.$$

If replaced with the above described k with no margin allowance, k2 is equal to 0.9 k, hence;

$$Mo/P = 0.9k/(K-0.9k).$$

Inversely, regarding plus 10 percentages, height k3 of the transfer material 2 in this situation is replaced with the above described k with no margin allowance, k2=1.1 k is approved;

$$Mo/P = 1.1k/(K-1.1k).$$

As the above mentioned, on the imprint apparatus 100 which allows ±10 percentages transcription margin to the transcription height k as a target, the following expression 3 is preferable to be approved;

$$1.1k/(K-1.1k) \geq Mo/P \geq 0.9k/(K-0.9k) \quad \text{(expression 3)}.$$

FIG. 4 is a descriptive drawing showing a state in case to allow the transcription margin like the above mentioned. As shown in FIG. 4A and FIG. 4B, if the effective pressure Mo and the atmosphere pressure P are set in a range the "expression 3" is satisfied, and the transfer material 2 on the substrate 3 is replicated using the imprint mold 4 (depth K of the concave part pattern 4A), shown in FIG. 4C, the transcription is performed in a range like 45-55 percentages transcription rate which is a plus or minus 10 percentages range of the transcription height k against a target 50 percentages transcription rate.

The imprint apparatus 100 of the present variation is characterized in comprising: a substrate 3 on which a transfer material 2 is put, which has liquidity on certain condition; an imprint mold 4 which has the K [nm] depth concave part pattern 4A; a forcing unit 10 which generates forcing power to force the imprint mold 4 against the transfer material 2 on the substrate 3 at effective pressure Mo [Pa]; a decompression unit 13 which decompresses an atmosphere at pressure P [Pa] a space R in which the imprint mold 4 and the substrate 3 exist; forming a replica 17 which has a k [nm] height convex part pattern 17A corresponding to the concave part pattern 4A, by releasing the imprint mold 4 from the transfer material 2 after hardening the transfer material 2 under a situation in which the imprint mold 4 is forced against, wherein: the forcing unit 10 and the decompression unit 13 perform to generate the forcing power and decompress with satisfying:

$$1.1k/(K-1.1k) \geq Mo/P \geq 0.9k(K-0.9k).$$

As the above mentioned;

$$1.1k/(K-1.1k) \geq Mo/P \geq 0.9k/(K-0.9k),$$

by being satisfied the above expression, in case even if air comes inside of the concave part pattern 4A of the imprint mold 4 and be stuffed up inside, it is possible to have transcription with permitting actual transcription rate against target transcription and ±10 percents margin with almost no problem. As a result, it is not necessary to decompress down to over unnecessary too low pressure by the decompression unit 13, or to generate too much large forcing power by the forcing unit 10. Therefore, it is possible to downsize and simplify the imprint apparatus 100.

On a side note, at this time in this variation it is also possible to adopt the minimum forcing pressure Mmin as the effective as is same as the variation of the (1).

The imprint apparatus 100 in this case is characterized in that the forcing unit 10 and the decompression unit 13 generate forcing power and decompress, using inside area minimum forcing pressure Mmin [Pa] of contact area between the imprint mold 4 and the transfer material 2 as an effective pressure Mo, with satisfying:

$$1.1k/(K-1.1k) \geq M\text{min}/P \geq 0.9k(K-0.9k) \quad \text{(expression 4)}.$$

The imprint method in this case is characterized in forming a replica 17 which has a k [nm] height convex part pattern 17A corresponding to a concave part pattern 4A, by forcing an imprint mold 4 which has a K [nm] depth concave part pattern 4A against a liquid transfer material 2 under atmosphere pressure P [Pa], and releasing the imprint mold 4 after the transfer material 2 was hardened in this forced situation, wherein: the forcing and the atmosphere pressure are performed to set with satisfying:

$$1.1k/(K-1.1k) \geq Mo/P \geq 0.9k/(K-0.9k) \quad \text{(expression 4)}.$$

By adopting the inside area minimum forcing pressure Mmin [Pa] of the contact area between the imprint mold 4 and the transfer material 2 as the effective pressure Mo, if the following expression is satisfied:

$$1.1k/(K-1.1k) \geq M\text{min}/P \geq 0.9k/(K-0.9k).$$

It is possible to have transcription even on the worst condition, looking over the whole imprint apparatus 100, it is surely possible to have transcription. With this arrangement, practically, for example, in case there is insufficiency about forcing power scattering by the forcing unit 10 of the imprint apparatus 100, and smoothness in an inside area of the imprint mold 4, the transfer material 2 and the like, it is surely possible to have transcription.

(3) In Case to Transcribe with Turning Transcription an Atmosphere into Dry Circumstance It is one of selection to replace an atmosphere of the space R in the vacuum chamber 1 of the above mentioned imprint apparatus 100 with an appropriate gas such as nitrogen or argon and the like by a not shown substitution means connected the vacuum chamber 1 before starting to transcribe.

The imprint apparatus 100 of the variation is characterized in that a gas replacing unit converts the space R into dry environment.

In general, it is not necessary to take it into consideration to have condensation under air is compressed in a decompressed circumstance. By the above described replacing the atmosphere of the space R with, for example, nitrogen or argon and the like, and making the dry circumstance, it is possible to exclude completely probability to have condensation while transcribing. As a result, it is possible to improve designing accuracy and transcription margin and the like of the imprint apparatus 100.

(4) In Case to Use Thermoplastic Resin as a Transfer Material

In the above described explanation focused an example in case to use ultraviolet curable resin and the like which has a little temperature change while imprinting as the transfer material 2 (in particular, it is effectual in this case), however, it is not limited like this example. That is, it is available to use non liquid material under normal temperature (for example, thermoplastic resin used for thermal imprint). In this case, by sufficiently heating and making gas in the gap between the imprint mold 4 and the transfer material 2 at equal temperature before the imprint mold 4 touches the transfer material 2, the related expression (expression (1)-expression (4)) as same as the above described is able to be approved. On a side note, volume of the enclosed gas gets changed by cooling down while hardening in a status the imprint mold 4 is forced against thermoplastic resin. However, because the change faces for a direction of volume reduction, at least the transcription rate is not made got worse, it has no problem to prescribe by the above described "expression 1"-"expression 4".

FIG. 5 is a schematic configuration drawing showing abbreviated whole configuration of the imprint apparatus 200 as the variation which is another embodiment, corresponding to FIG. 1 in the above described embodiment. On the equal parts between FIG. 1 and FIG. 5 the same marks are assigned on each equal parts in FIG. 5, explanations are appropriately abbreviated and simplified.

In FIG. 5, in the imprint apparatus 200 there is a transfer material 202 made from thermoplastic resin on the substrate 3. According to the configuration of FIG. 1, the ultraviolet rays lamp 7 which relates irradiating ultraviolet rays, the optical fiber cable 6, the ultraviolet rays lens 8 and the transparent supporting body 15 are omitted.

The imprint mold 4 is supported by a mold holding mechanism 5 as same as FIG. 1. A molding heater 218 is provided on the top of the imprint mold 4. The substrate heater 219 is also provided on the substrate supporting body 15 on which the substrate 3 is arranged. A chamber heater 220 is newly provided inside the vacuum chamber 1. As rest of the configuration is same as the imprint apparatus 100 shown in FIG. 1, the explanation is omitted.

FIG. 6A-6F are a descriptive drawing conceptually showing each steps of the imprint method on the present embodiment to be practiced by the above described configured imprint apparatus 200, and correspond to the above described FIG. 2.

At first, a transfer material 202 (a thermoplastic resin solution or hardening-reactive resin) is applied on the substrate 3 shown in FIG. 6A through the nozzle 16 (not shown in FIG. 6B). Then, a layer of the transfer material 202 is configured (FIG. 6C).

Afterwards the substrate heater 219 is worked to keep hardening until the liquidity is almost disappeared under normal temperature, by raising temperature on the transfer material 202 until the solvent is evaporated, or by thermal reacting on hardening-reactive resin (FIG. 6C).

Afterwards the vacuum pump 13 is worked, atmosphere pressure of the space R in the vacuum chamber 1 is decompressed until it gets P [Pa]. In addition to substrate heater 219, a molding heater 218 and a chamber heater 220 are worked, the transfer material 2 is heated until it gets more than or equal to the glass transition temperature, and gets liquid (FIG. 6D).

After decompression and getting liquid like this, the substrate supporting body 15 is lifted by working the pressurization mechanism 10. With this arrangement, the imprint mold 4 is forced against the transfer material 202 on the substrate 3. In this situation the imprint mold 4 is forced against, the transfer material 202 is hardened through cooling down by the substrate heater 219, the mold heater 218 and the chamber heater 220 are stopped (FIG. 6E).

After hardening like this, the substrate supporting body 15 is lifted by working the pressurization mechanical 10. Through this motion, the imprint mold 4 is removed from the transfer material 202. The replica 217 which has a k [nm] height convex part pattern 217 corresponding to the concave part pattern 4A is configured (FIG. 6F). Afterwards, the vacuum pump 13 is stopped working, and the atmosphere pressure of the space R in the vacuum chamber 1 is got back to normal pressure. The substrate 3 on which the above configured replica 217 is put, is removed from the vacuum chamber 1 via not shown opening and closing means, and this transcription is completed.

In the above described series of procedures the pressurization mechanical 10 and the vacuum 13 perform to generate the forcing power and decompress, satisfying the above described each of "expression 1"-"expression 4", regarding depth K of the concave part pattern 4A of the imprint mold 4, height k of the convex part pattern 217A of the transfer material 202, the effective pressure Mo when the imprint mold 4 is forced against and pressure in the space R. With this arrangement, it is possible to have the same effect as each effect in the above described embodiments and each of the variations correspond to each expression.

FIG. 7 is a flowchart conceptually showing each of the procedures of the imprint methods using the above configured imprint apparatus 200. On a side note, the content of this flowchart shows works performed by the imprint apparatus 200, and a flow from a viewpoint on, for instance, a control program. In this flowchart, for example, thermal style (heating style) is adopted.

At first, in step S1, the imprint mold 4 is set. Next, in step S2, the control program instructs to set a transcription 3. In this status, a layer of the transfer material 202 (thermoplastic resin) is configured by an apparatus which is separately prepared on the substrate 3. In case the transfer material 202 is not configured in advance, further, in this step S2, the control program configures a layer of the transfer material 202 by applying the liquid transfer material 202 (thermoplastic resin solution or hardening-reactive resin) on the substrate 3 via the nozzle 16 (not shown in FIG. 5) provided in the vacuum chamber 1 in an appropriate status. Next, the control program works the substrate heater 219 to harden until liquidity is almost disappeared under normal temperature, until the solvent is evaporated by heating the transfer material 202, or until thermal reaction of the hardening-reactive resin.

Next, in step S3, parameters are set. Concretely speaking, depth K of the concave part pattern 4A and height k of the convex part pattern 7A configured on the transfer material 202 are inputted. With these setting, the pressurization mechanical 10 and the vacuum pump 13 come to generate forcing power and decompress, satisfying each of the above described "expression 1"-"expression 4", regarding depth K of the concave part pattern 4A of the imprint mold 4, height k of the convex part pattern 7A of the transfer material 202, pressure Mo when the imprint mold 4 is forced against and pressure P in the space R.

Next, in step S4, the control program determines pressure given by the pressurization mechanical 10 and atmosphere pressure given by the vacuum pump 13.

Afterwards, in step S5, the control program start working the vacuum pump 1, and decompresses atmosphere pressure in the space R in the vacuum chamber 1 to become P [Pa]. In step S5a, the control program starts working the molding heater 218 and a chamber heater 220 in addition to substrate heater 219, raises temperature of the transfer material 202, the substrate 3, the imprint mold 4 and the transcription atmosphere until the transfer material 202 gets more than (or equal to) glass transition temperature, makes the transfer material 202 liquid.

Afterwards, in step S6, the control program lifts the substrate supporting, body 15 by working the pressurization mechanism 10. With this arrangement, the imprint mold 4 is forced at pressure M against the transfer material 202 on the transcription 3. Next, in step S7 the control program stops working and cool down the substrate heater 219, the mold heater 218 and the chamber heater 220 in a status the imprint mold 4 is forced against, the transfer material 202 is hardened.

After hardening like this process, in step S8, the control program moves the substrate supporting body 15 downward by working the pressurization mechanism 10 again. Through this motion, the imprint mold 4 is removed and the replica 217 is configured as having a height k [nm] convex part pattern 217A corresponding to the concave part pattern 4A. Afterwards, in step S9, the control program stops working the vacuum pump 13, and gets atmosphere pressure back to normal pressure in the space R inside of the vacuum chamber 1, and takes out the substrate 3 on which the above configured replica 217 is put, from the vacuum chamber 1 via not shown opening and closing means, and completes the transcription.

Through the above series of the procedures, in an embodiment of the present variation the control program controls the forcing unit 10 (pressurization mechanism) and the pressure adjusting unit 13 (vacuum pump) based on depth K [nm] of the concave part pattern 4A on the imprint mold 4 and height K [nm] of the convex part pattern 217A on the convex part pattern 217A.

The imprint apparatus 100 of the above described each embodiment comprises a substrate 3 on which a transfer material 2 is put, which has liquidity on certain condition; an imprint mold 4 which has the K [nm] depth concave part pattern 4A; a pressurization mechanism 10 which generates forcing power to force the imprint mold 4 against the transfer material 2 on the substrate 3 at effective pressure Mo [Pa]; and a vacuum pump 13 decompresses an atmosphere up to pressure P [Pa] in a space R in which the imprint mold 4 and the substrate 3 exist; and forms a replica 17 which has a k [nm] height convex part pattern 17A corresponding to a concave part pattern 4A, by releasing the imprint mold 4 from the transcription 2 after hardening the transfer material 2 in a status the imprint mold 4 is forced against, wherein: the pressurization mechanism 10 and the vacuum pump 13 perform to generate the forcing power and decompress with satisfying:

$$Mo/P \geq k/(K-k).$$

By adopting the relation: $Mo/P \geq k/(K-k)$ (in other words, by getting the atmosphere pressure P less than or equal to certain value which an equal sign is approved, or getting the effective pressure Mo more than or equal to certain value which an equal sign is approved), even air comes inside of the concave part pattern 4A of the imprint mold 4, it is possible to have transcription with no problem. Unless the above described relation which is necessary condition to have sure transcription even if air comes inside, it is not necessary to decompress down to unnecessary low pressure given by the vacuum pump 13, to generate unnecessary too much forcing power given by the pressurization mechanism 10. As a result, it is possible to downsize and simplify the imprint apparatus 100. This is as same as in the imprint apparatus 200 of the other embodiment.

The imprint method of the above described each embodiment is for forming a replica 17 which has a k [nm] height convex part pattern 17A corresponding to a concave part pattern 4A, by forcing an imprint mold 4 which has a K [nm] depth concave part pattern 4A against a liquid transfer material 2 under atmosphere pressure P [Pa], and releasing the imprint mold 4 after the transfer material 2 was hardened in this forced situation, wherein: the forcing and the atmosphere pressure are performed to set with satisfying:

$$Mo/P \geq k/(K-k).$$

By adopting the relation: $Mo/P \geq k/(K-k)$ (in other words, by getting atmosphere pressure P less than or equal to certain value which an equal sign is approved, or getting the effective pressure Mo more than or equal to certain value which an equal sign is approved), even air comes into the concave part pattern 4A of the imprint mold 4, it is possible to have transcription with no problem. Under certain condition with satisfying the above described relation which is necessary condition to have sure transcription even if air comes into, it is not necessary to decompress down to unnecessary low pressure, to generate unnecessary too much forcing power for forcing against by the imprint mold 4. As a result, it is possible to downsize and simplify the imprint apparatus 100. This is as same as in the imprint apparatus 200 of the other embodiment.

The above described each embodiments are able to be applied to the following imprint apparatus and imprint method.

The present applied example explains concrete examples about manufacturing methods for the imprint mold for imprinting. On a side note, in the present applied example, the imprint mold for imprinting is manufactured by an electron beam. This applied example is an embodiment for manufacturing a patterned magnetic recording medium as an example of the magnetic recording media manufactured by this imprint mold for imprinting.

FIG. 8A to FIG. 8F are sectioned drawings showing one of examples about processes in which the imprint mold for imprinting in the present applied example. FIG. 9 is a process drawing showing detail manufacturing method for the imprint mold for imprinting in FIG. 8A to FIG. 8F.

At first, Shown in FIG. 8A and FIG. 9, after polishing and rinsing a substrate 71 consisted of materials such as a Si wafer and glass and the like, an electron beam resist film 72 for an electron beam is configured on the substrate 71 by spin coating and the like. Next, the electron beam resist film 72 is pre baked, shown in FIG. 8B, a latent image 72a is configured by printing lithography an electron beam resist film 72 with an electron beam ("signal record" in FIG. 9). Next, after configuring a groove part 72b in FIG. 8C by developing an electron beam resist film 72, the electron beam resist film 72 is post baked.

Next, shown in FIG. 8D, a nickel alloy thin film 73 is configured on an electron beam resist film 72 and a substrate 71 surface by sputtering methods, deposition methods and the iron electrolytic plating. At this situation, after the groove part 72b is replicated on the substrate 71 by etching the substrate 71 using the electron beam resist film 72 as a mask in stead of directly configuring the nickel alloy thin film 73 on the surface of the electron beam resist film 72, a nickel alloy film 73 is configured on the surface of the substrate 71 on which the groove part was configured corresponding to the groove part 72b by releasing the electron beam resist film 72.

Afterwards, shown in FIG. 8E, a nickel layer 74 is configured by performing the nickel electroforming on a surface of the nickel alloy thin film 73 using a nickel alloy thin 73 as a electrode. As shown in FIG. 8F, after the nickel layer 74 is removed from the substrate 71, shown in FIG. 8F, a master stamper 74A is obtained by polishing the upper surface of the nickel layer 74 and the like. On a side note, it is also possible to use a nickel ally layer as a stamper which is configured a nickel ally layer by the electroforming in stead of the nickel layer 74 and removed.

Shown in FIG. 9, a shape-reversed sub master stamper is obtained by attaching nickel on the master stamper 74A again through the electroforming. A baby stamper which has the same shape as the master stamper is obtained further, by attaching nickel to the sub master stamper. Further, a new stamper may be configured by transcribing the baby stamper.

By the way, the imprint mold and the imprint replica are effective for super minute patterns corresponding to extremely high area record density such as density is over 500 Gbpsi (Gbit/inch$^2$), in particular 1-10 Tbpsi. Concretely, by using an imprint mold which has approximately 25 nm pit interval patterns, it is possible to manufacture high density Patterned Media from the replica, of which recording density is over approximately 1 Tbpsi.

For realization for this method, it is preferable to use an electron beam lithography apparatus which enables to configure high minute patterns as a manufacturing method of a mask 12 is configured concave and convex parts.

Next, a pattern describing method for manufacturing dots shape of a patterned recording medium by this electron beam lithography apparatus is concretely explained.

The above described electron beam lithography apparatus comprises a mechanism which makes a substrate moved horizontally and a rotation stage which rotates the substrate on the resist applied substrate, and is an X-theta type electron beam lithography apparatus which describes by irradiating electronic lithography beams on the resist.

Dot patterns are configured by describing by a fixed interval, keeping the stage moved for the radius direction by this electron beam lithography apparatus. At this tune, it is possible to configure spirally arranged dots lines without inclination of the electron beam while turning. As anticipated in JP, A, 2002-367241, it is possible to describe dots lines centrically by printing by lithograph with gradually changed inclination values of the electron beams just like describing a concentric circle on the resist at every turn.

Needless to say, it is also fine to form areas configured servo patterns for extracting addresses and controlling track positions expect for dots patterns for data.

Generally, a pattern medium 80 which is called "Patterned Media" as a hard disk or a patterned hard disk, is, shown in FIG. 10, separated into servo pattern part 80 and patterned data track part 82. On a side note, in FIG. 10, dots patterns of the data track part 82 are only shown in peripheral part and internal circumference part. However, these dots patterns are deformed and omitted. Actually, these dots patterns exist along an effective whole radius of the disk. The servo pattern part 81 also exists in some places except for places shown in FIG. 10.

On the side note, a swinging arm head 83 is configured enabling to roll for a radius direction of the magnetic recording medium 80. The swinging arm head 83 reads data recorded in a magnetic recording area of the magnetic recording medium 80, or writes it.

In data track part 82, medium patterns are configured such as concentric arranged dots rows or line shaped. In the servo pattern part 81, line shaped patterns and the like which extend in a radius direction across tracks extract square patterns which show address information and track detection information, clock timings, are configured. In this situation, the servo pattern part 81 is formed as same as the present disk medium, whereas it, is fine to adopt patterns shape and form which differ from the present hard disk media, adopting servo patterns of the best suited new format for Patterned Media.

This patterned magnetic recording media 80 is formed through directly etching a recording material using a resist mask which is manufactured through developing a latent image printed by describing and lithography in the above described patterns describing method. However, efficiency of mass production tends to become extremely low. For that reason, it is preferable to use manufacturing method using an imprinting method as mass production process. This is a manufacturing method for patterned magnetic recording media by etching a recording material and so on, using a resin pattern as a mask which is replicated enabling mass production by having description with an imprint mold after once forming the imprint mold for imprinting from a resist mask.

Next, an embodiment is explained for manufacturing patterns magnetic recording media using the imprint apparatus in each of the embodiments on the present application.

FIG. 11 is a process flowchart showing an embodiment manufacturing a patterns magnetic recording medium. FIG. 12A to FIG. 12E and FIG. 13F to FIG. 13M are sectioned drawings showing detail of procedures for manufacturing the patterned magnetic recording medium. On a side note, the following procedures are merely one of variations.

Shown in FIG. 11, procedures for manufacturing patterns magnetic media generally consist of a replica forming process, an imprinting process, a etching process, nonmagnetic material filling process and a protection film (lubricating film) forming process, these processes are executed one by one.

Further, explaining in detail, at first in the replica forming process, shown in FIG. 12A, a substrate 116 which is going to turn into a base for a magnetic recording medium which consists of particular processing chemically strengthened glass, a Si wafer, an aluminum board and another material.

Next, shown in FIG. 12B, a recording layer 101 is filmed over on the substrate 116 by spattering and the like. On a side note, in case of a perpendicular magnetic recording medium, it is supposed to be a layered structural body shown with broken lines in FIG. 12B, such as a soft magnetic foundation layer, an intermediate layer, ferromagnetic layer and so on.

Next, a metal mask layer 102, made from Ta and/or Ti and the like, is formed on the recording film layer 101 by spattering, then the substrate 3 is formed. A thermoplastic resin resist such as polymethyl methacrylate resin (PMMA) is coated on the metal mask layer 102 as the transfer material 202 by spin coating and the like.

Further, in the imprinting process Shown in FIG. 12C, the imprint mold 4 is set on the imprint apparatus 200 shown in FIG. 12C to face a concave and convex surface faces the transfer material 202. That is, the imprint mold 4 is set on a mold supporting portion 218 by being supported a mold supporting mechanism 5 not shown in FIG. 12C. On the other hand, a mold supporting mechanism 5 on which the transcription 202 is put, is supported on the substrate supporting body 15.

In the imprint apparatus 200, as shown in FIG. 12D, after decompressing in the work chamber 1, by working the vacuum pump 13 if necessary. After keeping on heating until the transfer material 202 gets liquid if necessary, the transfer material 202 is forced. For instance, glass transition point of polymethyl methacrylate resin (PMMA) is approximately 100 degrees centigrade. Therefore, after having liquidity by heating up to 120-200 degrees centigrade (for example, approximately 160 degrees centigrade), it is forced at 1-10000 kPa (for instance, approximately 1000 kPa) as forcing power. At this time, it is preferable to make inside of the work chamber 1 the vacuum condition such as accomplished vacuum degree is lower than or equal to several hundred Pa (for example, approximately 10 Pa).

Then, by getting an atmosphere back and releasing the imprint mold 4, a replica 217 which is formed by transcribing the concave and convex pattern of the imprint mold 4 on the transfer material 202. Then, this imprinting process is completed.

In this situation, the concave and convex pattern depth of the imprint mold 4 is set enough to store bubbles which are generated while the imprint mold 4 is forced against. That is, the concave and convex pattern depth, which is formed on a surface of the transcription 4, is intended to make become deeper than the concave and convex part depth of the transfer material 202 which is desired to be left on the surface of the imprint mold 217 in the end.

Further, in etching process, as shown in FIG. 12F, the unnecessary transfer material 202 is removed by soft ashing using for instance, $O_2$ gas and the like with an etching mask. Next, Shown in FIG. 13G, the metal mask 102 is processed by etching, with $CHF_3$ gas, using the transfer material 202 as an etching mask.

Next, shown in FIG. 13H, the left transfer material 202 is removed by a wet process or a dry ashing with $O_2$ gas. Next, shown in FIG. 13I, the recording film layer 101 is processed by a dry etching process using Ar gas and the like, using the metal mask 102 as an etching mask. Shown in FIG. 13J, the left metal mask layer 10 is removed by each of a wet process and a dry etching.

Further, in the nonmagnetic material filling process, shown in FIG. 13K, a material which is not recorded in groove part of patterns by sputtering or applying and so on (in case of a magnetic recording medium, the nonmagnetic material 104 such as $SiO_2$ and the like), is filled.

Next, shown in FIG. 13L, the surface of the nonmagnetic material 104 is polished and evened by having etch-back process and chemically polishing process. As a result, it is possible to form structure that the recording material is separated by the nonmagnetic material 104.

Further, in the protection film (lubricating film) configuration process, shown in FIG. 13M, for instance, by forming the protection film 105 of the recording film layer 101 and the lubricating film 106 on the surface by coating method or dipping method, then, the pattern recording media is completed. The Patterned Media is completed through putting it on a hard disk drive. Through the above mentioned processes, it is possible to manufacture the patterned magnetic recording medium. On a side note, the imprint processes of the variation mentioned processes using the thermal type imprint apparatus 200 as an example as one of the above mentioned each embodiments, it is also possible to manufacture a patterned magnetic recording medium, using the embodiment of the UV type imprint apparatus 100 and the like.

What is claimed is:

1. An imprint apparatus that forms a replica which has a convex part pattern corresponding to a concave part pattern, comprising:
   a substrate on which a transfer material is put;
   an imprint mold which has said concave part pattern;
   a forcing unit which generates forcing power to force said imprint mold against said transfer material on said substrate at a minimum forcing pressure Mmin [Pa] at a contact area between said imprint mold and said transfer material;
   a pressure adjusting unit which adjusts a pressure of an atmosphere so that a pressure of a space surrounding said imprint mold and said substrate becomes a pressure P [Pa]; and
   a control unit,
      wherein said control unit controls said forcing unit and said pressure adjusting unit based on depth K [nm] of said concave part pattern of said imprint mold and height k [nm] of said convex part pattern of said replica, and
   wherein said control unit controls said forcing unit and said pressure adjusting unit with satisfying:

$Mmin/P \geq k/(K-k)$.

2. The imprint apparatus according to claim 1, wherein: said pressure adjusting unit is a decompression unit.

3. The imprint apparatus according to claim 1, wherein: said control unit controls said forcing unit and said pressure adjusting unit with satisfying:

$99 \geq Mmin/P \geq 9$.

4. The imprint apparatus according to claim 1, further comprising:
   an input unit which inputs depth K [nm] of said concave part pattern, height k [nm] of said convex part pattern.

5. The imprint apparatus according to claim 1, further comprising:
   a gas replacing unit converts said space into dry environment.

6. An imprint apparatus that forms a replica which has a convex part pattern corresponding to a concave part pattern, comprising:
   a substrate on which a transfer material is put;
   an imprint mold which has said concave part pattern;
   a forcing unit which generates forcing power to force said imprint mold against said transfer material on said substrate at a minimum forcing pressure Mmin [Pa] at a contact area between said imprint mold and said transfer material;
   a pressure adjusting unit which adjusts a pressure of an atmosphere so that a pressure of a space surrounding said imprint mold and said substrate becomes a pressure P [Pa]; and
   a control unit,
      wherein said control unit controls said forcing unit and said pressure adjusting unit based on depth K [nm] of said concave part pattern of said imprint mold and height k [nm] of said convex part pattern of said replica, and
   wherein said control unit controls said forcing unit and said pressure adjusting unit in case height k [nm] of said convex part pattern is less than said depth K, with satisfying:

$1.1k/(K-1.1k) \geq Mmin/P \geq 0.9k/(K-0.9k)$.

7. An imprint apparatus that forms a replica which has a convex part pattern corresponding to a concave part pattern, said imprint apparatus comprising:
   a vacuum chamber;
   a substrate provided within the vacuum chamber, the substrate providing a location for placing a transfer material;
   an imprint mold having a concave part pattern;
   a forcing unit which generates a forcing power to force said imprint mold against the transfer material located on said substrate at a minimum forcing pressure Mmin [Pa] at a contact area between said imprint mold (4) and said transfer material (2); and
   a pressure adjusting unit (13) which adjusts a vacuum pressure so that a pressure of a space within said vacuum chamber surrounding said imprint mold and said substrate becomes a pressure P [Pa],
   wherein said forcing unit and said pressure adjusting unit are control based on a depth K [nm] of said concave part pattern of said imprint mold and a height k [nm] of said convex part pattern of said replica,
   wherein said forcing unit and said pressure adjusting unit are controlled to satisfy $Mmin/P \geq k/(K-k)$.

8. The imprint apparatus according to claim 7, wherein said pressure adjusting unit is a decompression unit.

9. The imprint apparatus according to claim 7, wherein said forcing unit and said pressure adjusting unit are controlled to satisfy $99 \geq Mmin/P \geq 9$.

10. An imprint apparatus that forms a replica which has a convex part pattern corresponding to a concave part pattern, said imprint apparatus comprising:
   a vacuum chamber;
   a substrate provided within the vacuum chamber, the substrate providing a location for placing a transfer material;

an imprint mold having a concave part pattern;

a forcing unit which generates a forcing power to force said imprint mold against the transfer material located on said substrate at a minimum forcing pressure Mmin [Pa] at a contact area between said imprint mold (4) and said transfer material (2);

a pressure adjusting unit (13) which adjusts a vacuum pressure so that a pressure of a space within said vacuum chamber surrounding said imprint mold and said substrate becomes a pressure P [Pa]; and a control unit, wherein said forcing unit and said pressure adjusting unit are controlled, by the control unit, based on a depth K [nm] of said concave part pattern of said imprint mold and a height k [nm] of said convex part pattern of said replica, wherein, with the height k [nm] of said convex part pattern less than the depth K, said forcing unit and said pressure adjusting unit are controlled to satisfy:

$1.1k/(K-1.1k) \geqq M\mathrm{min}/P \geqq 0.9k/(K-0.9k)$.

* * * * *